United States Patent
Cheng et al.

(10) Patent No.: US 9,954,109 B2
(45) Date of Patent: Apr. 24, 2018

(54) VERTICAL TRANSISTOR INCLUDING CONTROLLED GATE LENGTH AND A SELF-ALIGNED JUNCTION

(71) Applicant: International Business Machines Corporation, Armonk, NY (US)

(72) Inventors: Kangguo Cheng, Schenectady, NY (US); Ramachandra Divakaruni, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/147,342

(22) Filed: May 5, 2016

(65) Prior Publication Data

US 2017/0323977 A1     Nov. 9, 2017

(51) Int. Cl.
| | |
|---|---|
| *H01L 21/225* | (2006.01) |
| *H01L 21/324* | (2006.01) |
| *H01L 29/66* | (2006.01) |
| *H01L 29/786* | (2006.01) |
| *H01L 29/423* | (2006.01) |
| *H01L 29/51* | (2006.01) |

(52) U.S. Cl.
CPC .... *H01L 29/78621* (2013.01); *H01L 21/2252* (2013.01); *H01L 21/324* (2013.01); *H01L 29/42392* (2013.01); *H01L 29/517* (2013.01); *H01L 29/66492* (2013.01); *H01L 29/66666* (2013.01); *H01L 29/78642* (2013.01)

(58) Field of Classification Search
CPC ....... H01L 21/823487; H01L 29/78642; H01L 29/66666; H01L 29/66909; H01L 29/7827; H01L 29/8083
See application file for complete search history.

(56) References Cited

U.S. PATENT DOCUMENTS

| | | | |
|---|---|---|---|
| 6,027,975 A | 2/2000 | Hergenrother et al. | |
| 6,690,040 B2 | 2/2004 | Chaudhry et al. | |
| 6,709,904 B2 | 3/2004 | Chaudhry et al. | |
| 6,773,994 B2 | 8/2004 | Chittipeddi et al. | |
| 7,033,877 B2 | 4/2006 | Chaudhry et al. | |
| 7,176,089 B2 | 2/2007 | Furukawa et al. | |
| 8,569,182 B2 | 10/2013 | Park et al. | |
| 8,704,291 B2 | 4/2014 | Inagawa et al. | |
| 2003/0052365 A1* | 3/2003 | Chaudhry ........... | H01L 27/0629 257/328 |
| 2005/0112817 A1* | 5/2005 | Cheng ............... | H01L 21/82380 438/219 |
| 2011/0147842 A1 | 6/2011 | Cappellani et al. | |
| 2015/0011066 A1 | 1/2015 | Mizokuchi et al. | |
| 2015/0179763 A1 | 6/2015 | Inagawa et al. | |

* cited by examiner

*Primary Examiner* — Raj R Gupta
(74) *Attorney, Agent, or Firm* — Cantor Colburn LLP; Vazken Alexanian

(57) ABSTRACT

A vertical transistor includes a gate structure interposed between a proximate spacer doped with a first dopant-type and a distal spacer doped with the first dopant-type. The proximate spacer is formed on an upper surface of a semiconductor substrate. At least one channel region extends vertically from the proximate doping source layer to the distal doping source layer. A proximate S/D extension region is adjacent the proximate spacer and a distal S/D extension region is adjacent the distal spacer. The proximate and distal S/D extension regions include dopants that match the first dopant-type of the proximate and distal doping sources.

16 Claims, 7 Drawing Sheets

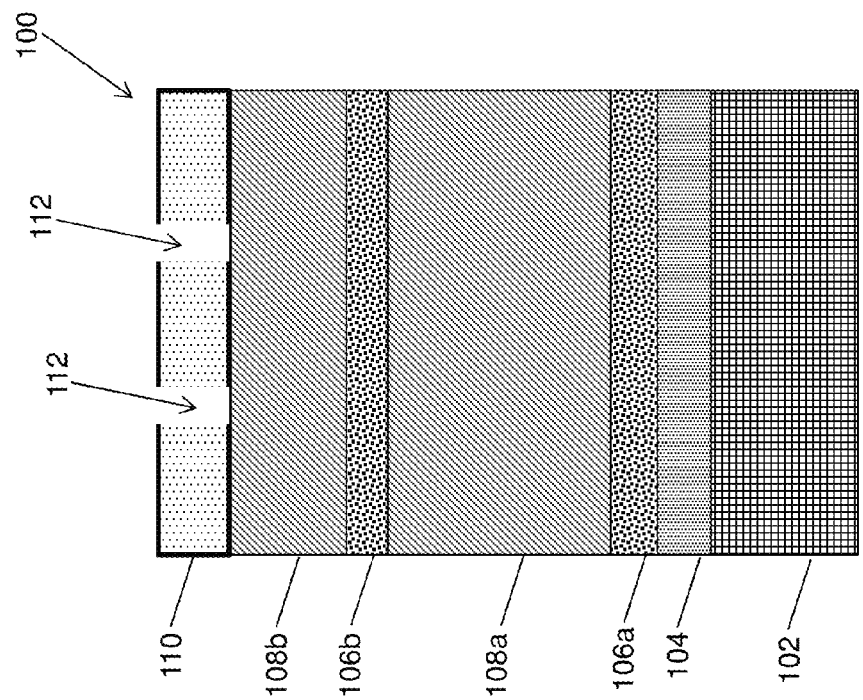
FIG. 2
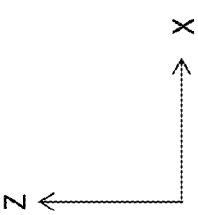
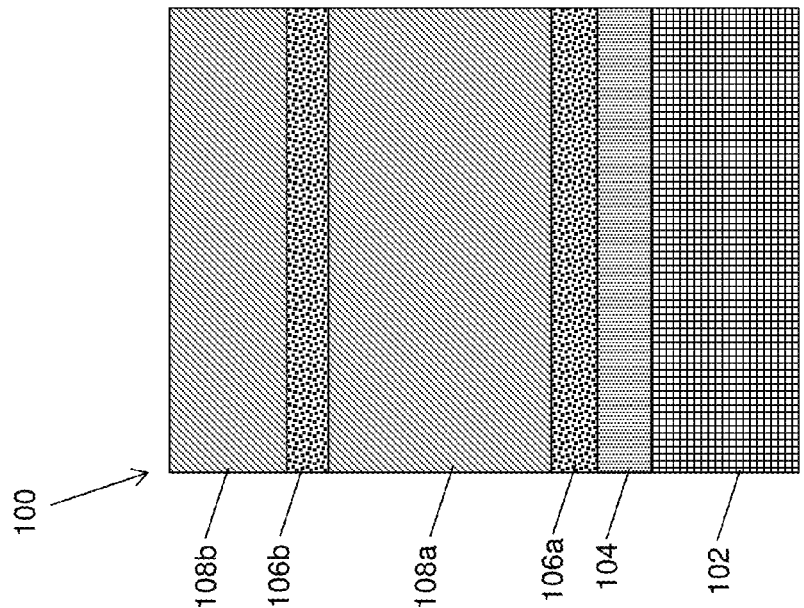
FIG. 1

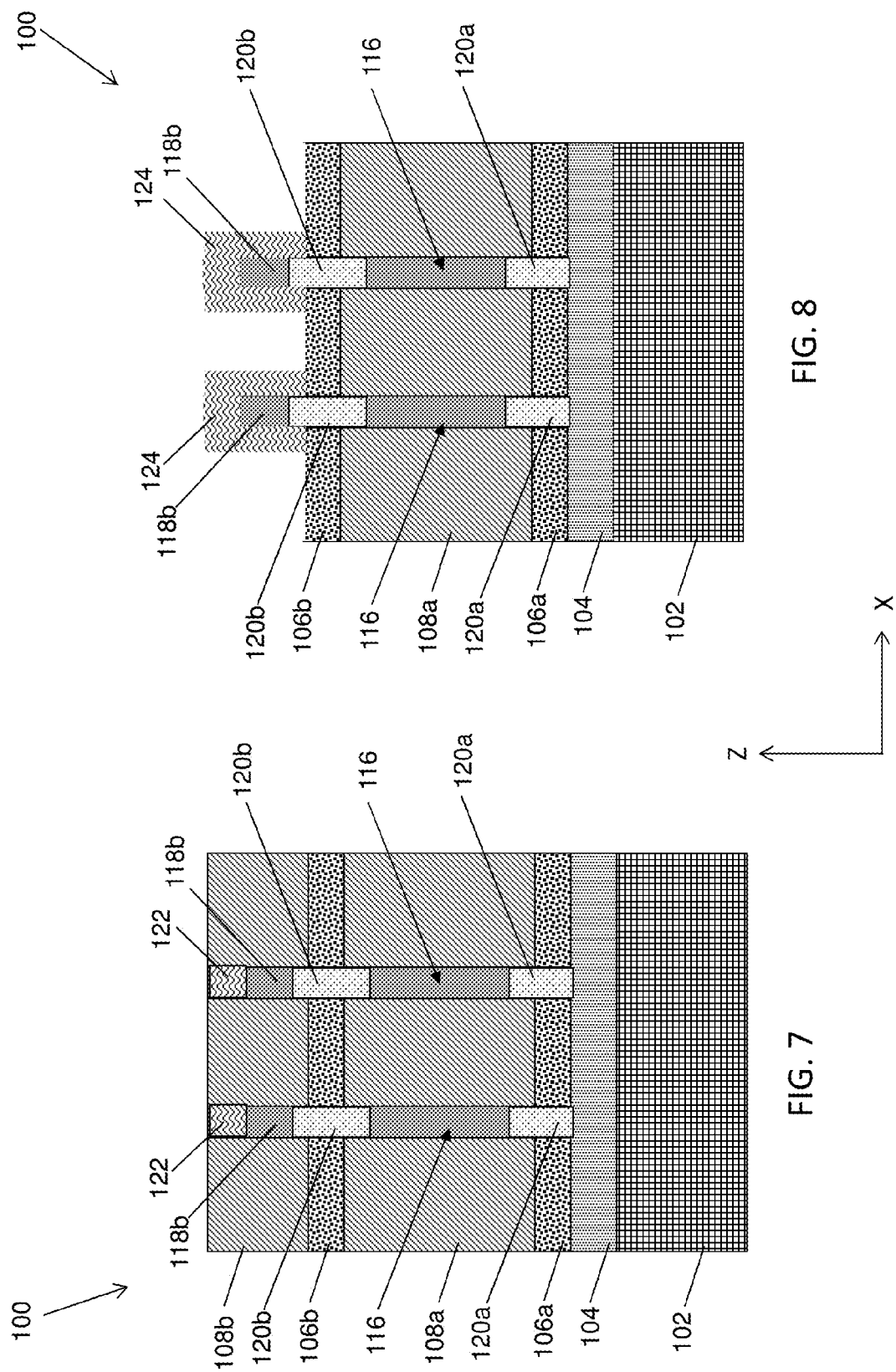

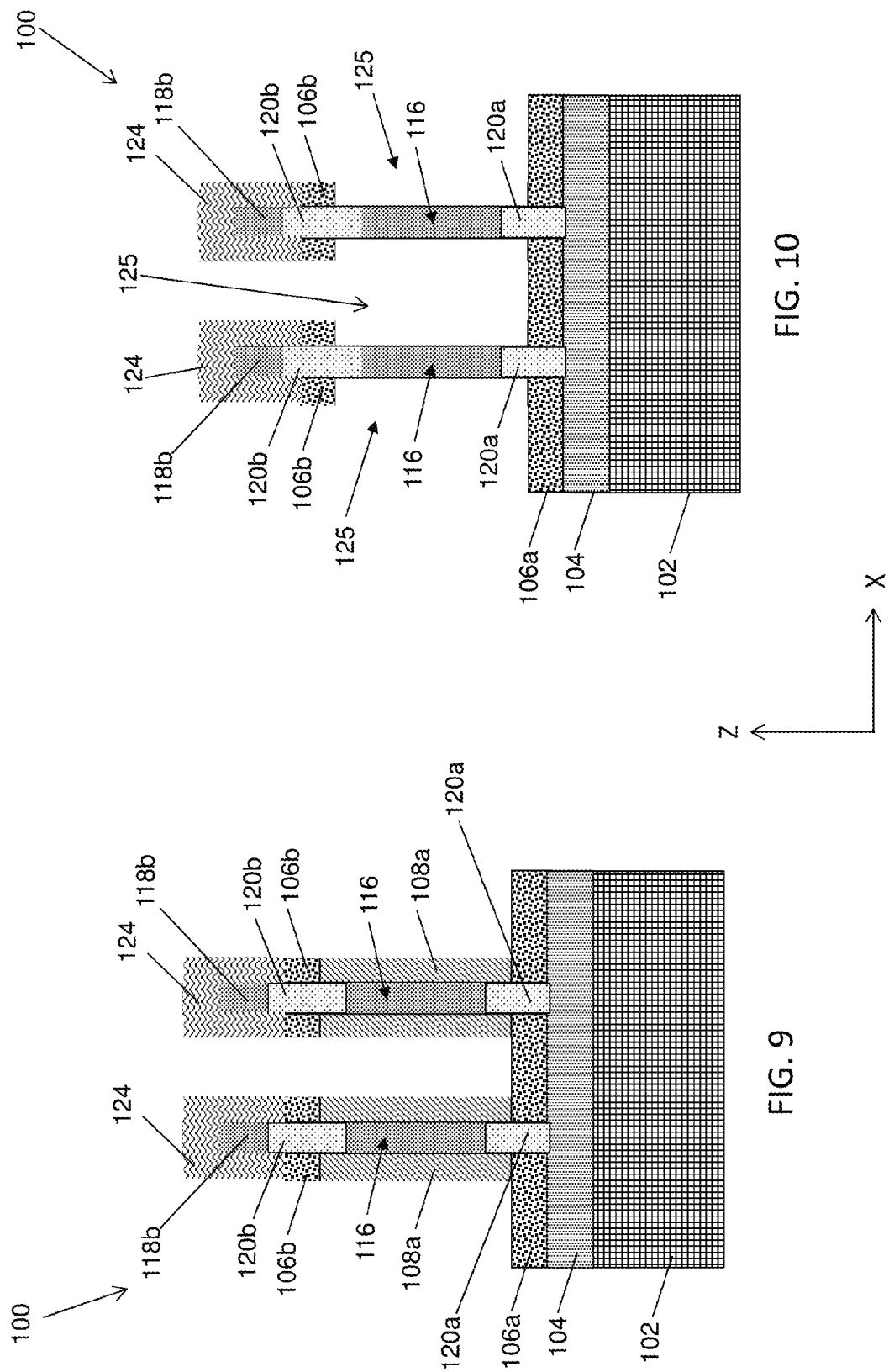

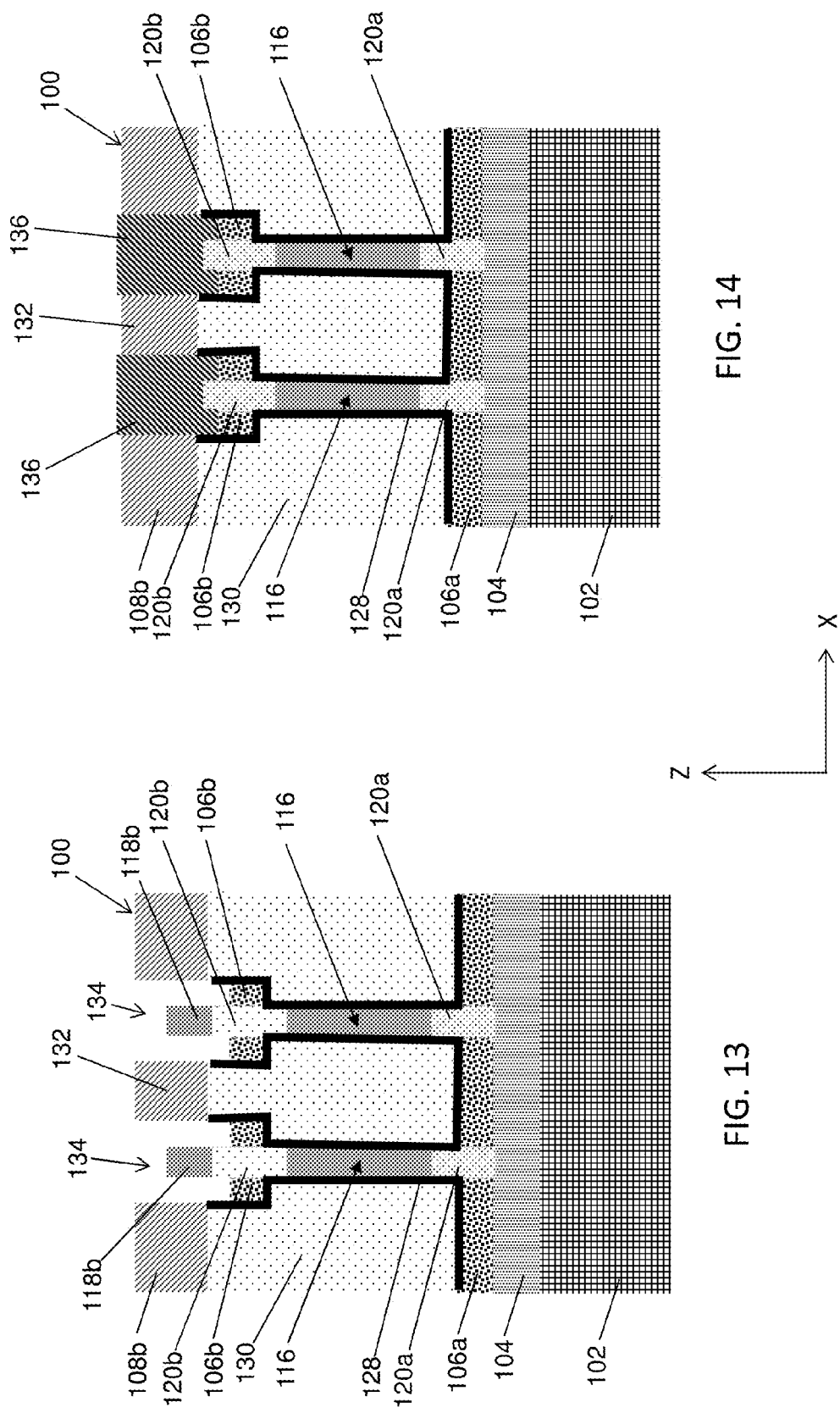

VERTICAL TRANSISTOR INCLUDING CONTROLLED GATE LENGTH AND A SELF-ALIGNED JUNCTION

BACKGROUND

The present invention relates to semiconductor devices, and more specifically, to a vertical-type transistor.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint without comprising necessary FET device performance characteristics. When forming these vertical FETS, the source/drain (S/D) regions are arranged at opposing ends of a vertical channel region.

SUMMARY

According to a non-limiting embodiment of the present invention, a vertical transistor includes a gate structure interposed between a proximate spacer doped with a first dopant-type and a distal spacer doped with the first dopant-type. The proximate spacer is formed on an upper surface of a semiconductor substrate. At least one channel region extends vertically from the proximate doping source layer to the distal doping source layer. A proximate S/D extension region is adjacent the proximate spacer and a distal S/D extension region is adjacent the distal spacer. The proximate and distal S/D extension regions include dopants that match the first dopant-type of the proximate and distal doping sources.

According to another non-limiting embodiment, a method of forming source/drain (S/D) extension regions in a vertical transistor comprises forming a semiconductor structure having a first sacrificial layer interposed between proximate and distal doping source layers. The method further includes forming at least one channel region that extends vertically from the proximate doping source layer to the distal doping source layer. The method further includes annealing the semiconductor structure such that dopants are diffused from the proximate and distal doping source layers to form a proximate S/D extension region adjacent the proximate doping source layer and a distal S/D extension region adjacent the distal S/D extension region.

According to yet another non-limiting embodiment, a method of forming a gate structure in a vertical transistor comprises forming a semiconductor structure having a first sacrificial layer interposed between proximate and distal doping source layers. The first sacrificial layer surrounds a channel region and defines a desired gate length of the vertical transistor. The method further includes annealing the semiconductor structure such that dopants are diffused from the proximate and distal doping source layers to form opposing proximate and distal S/D extension regions that extend into the channel region. The method further includes selectively removing the first sacrificial layer to form a void that exposes the region, and filling the void with a gate metal material so as to form a gate structure having a gate length that substantially matches the desired gate length.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. FIGS. 1-14 are a series of views illustrating a method of forming a vertical FET device according to exemplary embodiments of the present teachings, in which:

FIG. 1 is a cross-sectional view of a starting semiconductor structure including a doped epitaxially grown semiconductor layer formed atop a semiconductor substrate, and an arrangement of sacrificial layers and doping source layers stacked atop the doped epitaxially grown semiconductor layer according to a non-limiting embodiment;

FIG. 2 illustrates the semiconductor structure of FIG. 1 after patterning a masking layer deposited on an upper surface of a first sacrificial layer;

FIG. 3 illustrates the semiconductor structure of FIG. 2 after performing an etching process to transfer patterned trenches into the stacked arrangement of sacrificial layers and doping source layers while stopping on an upper surface of the doped epitaxially grown semiconductor layer;

FIG. 4 illustrates the semiconductor structure of FIG. 3 following an epitaxial growth process that fills the trenches with a semiconductor channel material;

FIG. 5 illustrates the semiconductor structure of FIG. 4 undergoing a thermal anneal process to diffuse dopants from the doping source layers;

FIG. 6 illustrates the semiconductor structure of FIG. 5 having doped extension regions in the semiconductor channel material formed in response to the thermal anneal process;

FIG. 7 illustrates the semiconductor structure of FIG. 6 after forming a channel cap on a distal end of the semiconductor channel material;

FIG. 8 illustrates the semiconductor structure of FIG. 7 after selectively etching the second sacrificial layer and forming sacrificial hard masks that encapsulate the exposed semiconductor channel material;

FIG. 9 illustrates the semiconductor structure of FIG. 8 following an etching process that stops on an upper surface of a proximate doping source layer to remove portions of a distal doping source layer and a second sacrificial layer not covered by the sacrificial hard masks;

FIG. 10 illustrates the semiconductor structure of FIG. 9 following a selective etching process that removes the remaining second sacrificial layer so as to expose a portion of the semiconductor channel material located between the proximate and distal doping source layers;

FIG. 11 illustrates the semiconductor structure of FIG. 10 after depositing a gate film that conforms to exposed surfaces of the semiconductor structure, and following deposition of a gate conductor material that surrounds the semiconductor channel material and the sacrificial hard masks;

FIG. 12 illustrates the semiconductor structure of FIG. 11 following an etching process that etches a portion of the gate conductor material until reaching the gate film, and after depositing a nitride cap atop the etched gate conductor material to cover the sacrificial hard masks;

FIG. 13 illustrates the semiconductor structure of FIG. 12 after removing the sacrificial hard masks to form cavities in the nitride cap that expose the distal portions of the semiconductor channel material; and FIG. 14 illustrates the semiconductor structure of FIG. 13 after epitaxially growing a doped semiconductor material from the distal portions of the semiconductor channel material to fill the cavities.

DETAILED DESCRIPTION

Figure 4:
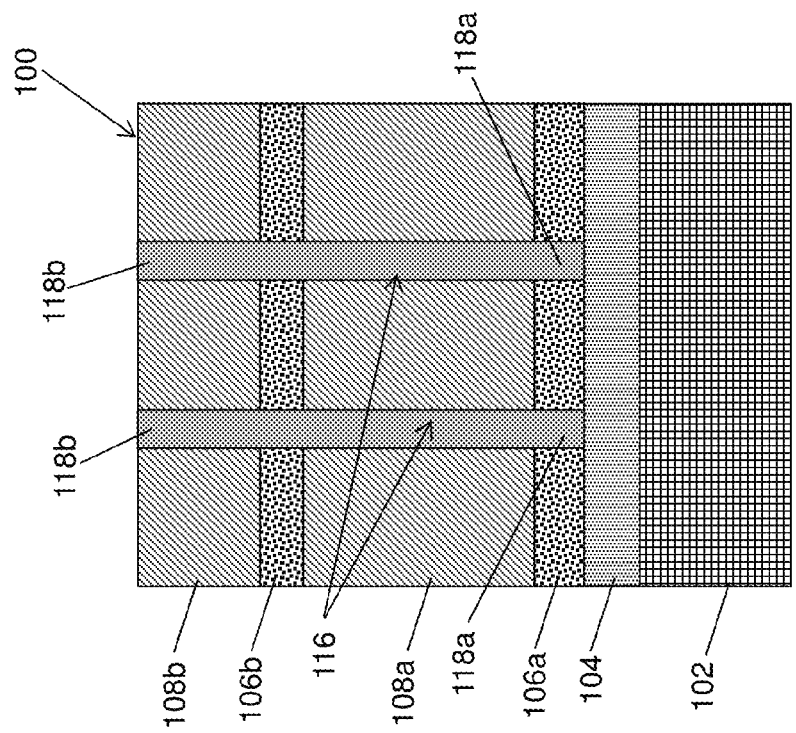

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of a coupler system according to the present disclosure utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed discussion of one or more embodiments, a vertical-type semiconductor structure (e.g., a vertical FET) is provided having a channel region interposed between opposing extension regions. Fabrication methodologies and resulting structures are disclosed herein that allow the length of the channel region to be precisely controlled based on the dimensions of the extension regions. In addition, the disclosed diffusion process, which is used to form the extensions regions, causes the source/drain (S/D) to be self-aligned with respect to the gate structure of the vertical FET.

With reference now to FIG. 1, a starting semiconductor structure for fabricating a vertical-type semiconductor device such as a vertical FET, for example, is illustrated according to a non-limiting embodiment. The starting semiconductor structure 100 extends along a first axis (e.g., a Z-axis) to define a vertical height, a second axis (e.g., an X-axis) to define a distance of a first side (i.e., a first side distance).

The starting semiconductor structure 100 includes a semiconductor substrate 102. The semiconductor substrate 102 may include a bulk semiconductor substrate or a semiconductor-on-insulator (SOI) substrate as understood by one of ordinary skill in the art. In at least one embodiment, the material of the semiconductor substrate is silicon (Si). Other semiconductor substrates are also conceived. The substrate 102 may comprise other structures (not shown) such as isolation, doped wells that can be formed by techniques well known in the art.

Optionally, a doped semiconductor layer 104 is formed atop a semiconductor substrate 102. The doped semiconductor layer 104 may be formed by any suitable doping techniques such as ion implantation, plasma doping, in-situ doped epitaxy growth, solid phase doping, liquid phase doping, gas phase doping, etc. In some embodiments, a thermal anneal is performed after dopant incorporation process to activate dopants. In some embodiments, the thermal anneal step is skipped. In some embodiments, the doped semiconductor layer 104 is formed by epitaxy and the doped semiconductor layer 104 may have the same material as the substrate or different material from the substrate. For example, the doped semiconductor layer 104 can be silicon germanium or silicon doped with p-type dopants such as boron, gallium, indium for p-type transistors. The doped semiconductor layer 104 can be silicon germanium or silicon doped with n-type dopants such as phosphorus, arsenic, antimony for n-type transistors. The doped semiconductor layer 104 may serve as a first source/drain (S/D) region 104 (i.e., a proximate S/D region 104) that is located proximate to the semiconductor substrate 102. In at least one embodiment, doped semiconductor layer 104 may have a vertical thickness ranging, for example, from approximately 10 nm to approximately 80 nm. Various epitaxial growth processes may be used to grow the doped semiconductor layer 104. For example, the doped semiconductor layer 104 may be epitaxially grown using chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. In at least one embodiment, the doped semiconductor layer 104 can be omitted.

The starting semiconductor structure 100 further includes an alternating arrangement of sacrificial layers and doping source layers stacked atop the doped semiconductor layer 104. The alternating arrangement includes a proximate doping source layer 106a, a first sacrificial layer 108a, a distal doping source layer 106b, and a second sacrificial layer 108b. The proximate and distal doping source layers 106a-106b comprise a doped-dielectric material capable of diffusing its local dopants in response to a thermal anneal process. The doping source layers 106a-106b may also serve as spacers (e.g., upper and lower spacers) that protect S/D regions during subsequent fabrication processes discussed in greater detail below.

The dopant source material of the doping source layers 106a-106b may be any suitable material containing dopants such as arsenic (As), phosphorous (P), antimony (Sb) for an n-type transistor, or, in the event of a p-type transistor is desired, boron (B), gallium (Ga). In at least one embodiment, the proximate and distal doping source layers 106a-106b comprise an n-type doped dielectric material such as, for example, arsenic-doped silicate glass (ASG), phosphorus doped silicate glass (PSG), phosphorus oxide (e.g., $P_2O_5$), or arsenic oxide (e.g., $As_2O_3$) In at least one embodiment, the proximate and distal doping source layers 106a-106b comprise an p-type doped dielectric material such as, for example, boron-doped silicate glass (BSG), boron oxide (e.g., $B_2O_3$). Other suitable dopant source materials are also conceived. The doping source layers 106a-106b may be deposited by a chemical vapor deposition (CVD) process, such as low pressure chemical vapor deposition (LPCVD), and plasma enhanced chemical vapor deposition (PECVD), atomic layer deposition (ALD), etc. In the exemplary embodiment described hereinafter, ASG is used as the n-type dopant source material. In the exemplary embodiment described hereinafter, BSG is used as the p-type dopant source material. The vertical thickness of the proximate and distal doping source layers 106a-106b range, for example, from approximately 2 nm to approximately 10 nm. Other thickness is also conceived. The dopant concentration in doping source layers ranges from $1E20/cm^3$ to $5E21/cm^3$, although lower or higher dopant concentration is also conceived.

The first and second sacrificial layers 108a-108b may comprise various nitride materials including, but not limited to, silicon nitride (SiN). The first sacrificial layer 108a can be deposited by any suitable techniques such as CVD or ALD. The thickness of the first sacrificial layer 108a can be precisely controlled by the deposition process. In at least one embodiment, the first sacrificial layer 108a defines the desired gate length of a completed vertical-type semiconductor structure 100. The vertical thickness (i.e., distance along the Z-axis) of the first sacrificial layer 108a ranges, for example, from approximately 10 nm to approximately 50 nm. Other thickness is also conceived. Accordingly, a vertical-type semiconductor device fabricated according to at least one embodiment of the present teachings reduces the device's susceptibility to gate recess variations.

According to a non-limiting embodiment, the proximate doping source layer 106a is formed on an upper surface of the doped semiconductor layer 104. The first sacrificial layer 108a may then be deposited on the upper surface of the proximate doping source layer 106a. The distal doping source layer 106b may then be formed on upper surface of the first sacrificial layer 108a. The second sacrificial layer 108b may then be deposited on an upper surface of the distal doping source layer 106b. In this manner, the alternating stacked arrangement of doping source layers 106a-106b and sacrificial layers 108a-108b may be formed atop the doped semiconductor layer 104 as illustrated in FIG. 1.

Turning to FIG. 2, the semiconductor structure 100 is illustrated after patterning a masking layer 110 deposited on an upper surface of the first sacrificial layer 108a. The masking layer 110 may include a photosensitive material that is deposited using, for example, a spin coating process followed by photolithography. Alternatively, masking layer 110 may include a hardmask layer such as amorphous carbon. One or more patterns 112 are subsequently formed in the masking layer 110 using any suitable patterning techniques as further illustrated in FIG. 2. Patterns 112. In one embodiment, for example, the patterns 112 are formed according to photolithography techniques. In one embodiment, the patterns 112 are formed by sidewall image transfer (SIT) techniques.

Figure 3:
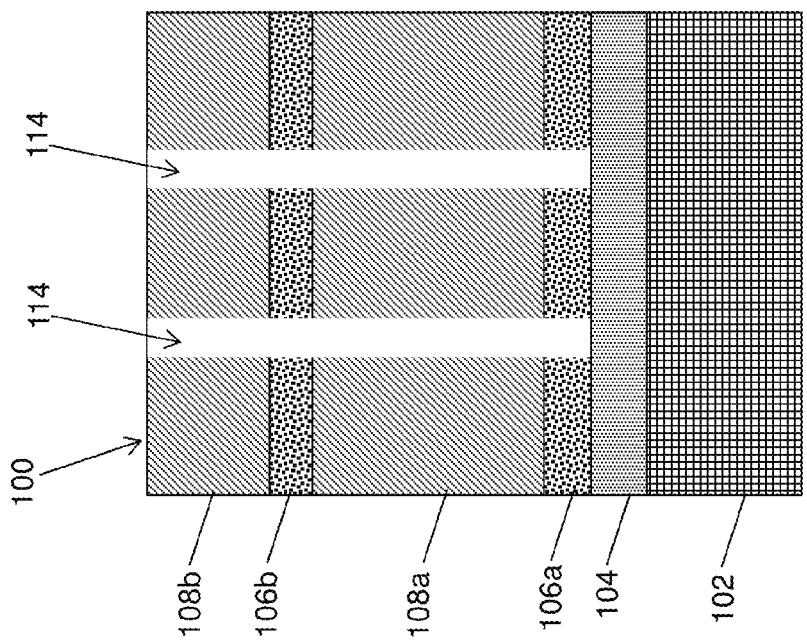

Referring now to FIG. 3, the patterns 112 are transferred into the alternating stacked arrangement of doping source layers 106a-106b and sacrificial layers 108a-108b. In at least one embodiment, a single etching process selective to a semiconductor material may be used to transfer the patterns while stopping on an upper surface of the doped semiconductor layer 104. Accordingly, trenches 114 extend through the alternating stacked arrangement of doping source layers 106a-106b and sacrificial layers 108a-108b to expose a portion of the doped semiconductor layer 104, or to expose a portion of the substrate 102 in the case that the doped semiconductor layer 104 is not present. In at least one embodiment, the trenches 114 have a laterally width (i.e., distance extending along the X-axis) ranging from approximately 3 nm to approximately 20 nm. Other thickness is also conceived. Alternatively, the patterns 112 may be transferred into the alternating stacked arrangement of doping source layers 106a-106b and sacrificial layers 108a-108b using multiple different etching processes. For example, a first etching process selective to an arsenic-doped oxide material may be performed so as to transfer the patterns 112 into the second sacrificial layer 108b while stopping on an upper surface of the distal doping source layer 106b. Accordingly, trenches 114 expose an upper surface of the distal doping source layer 106b. Thereafter, a second etching process selective to a nitride material may be used to punch through the distal doping source layer 106b, thereby exposing the underlying first sacrificial layer 108a. A similar etching process selective to an arsenic-doped oxide material as described above may be performed to extend the trenches 114 into the first sacrificial layer 106a while stopping on an upper surface of the proximate doping source layer 106a. Lastly, an etching process selective to a semiconductor material may be performed to punch through the proximate doping source layer 106a. In this manner, the trenches 114 expose a portion of the underlying doped semiconductor layer 104, or to expose a portion of the substrate 102 in the case that the doped semiconductor layer 104 is not present.

Referring to FIG. 4, the semiconductor structure 100 is illustrated following an epitaxial growth process that fills the trenches (previously indicated as element 114) with a semiconductor channel material 116. The semiconductor channel material 116 may comprise various semiconductor materials including, for example, silicon, silicon germanium, germanium, etc. The semiconductor channel material 116 may be undoped or doped with a dopant concentration less than $1E19/cm^3$. The channel dopants, if present, may have a dopant polarity opposite from the dopants in the doped source layer 106a and 106b, and/or opposite from dopants existing in the completed source/drain regions which are described in greater detail below.

A chemical mechanical planarization (CMP) process that stops on an upper surface of the second sacrificial layer 108b may be performed to remove excess semiconductor channel material 116 from atop the second sacrificial layer 108b. In this manner, a channel region 116 is formed having a proximate channel end 118a and a distal channel end 118b. As further illustrated in FIG. 4, the proximate channel end 118a contacts the doped semiconductor layer 104 while the distal channel end 118b is flush with an upper surface of the second sacrificial layer 108b. Accordingly, the proximate channel end 118a is proximate (e.g., nearer) to the semiconductor substrate 102 compared to the distal channel end 118b.

Figure 5:
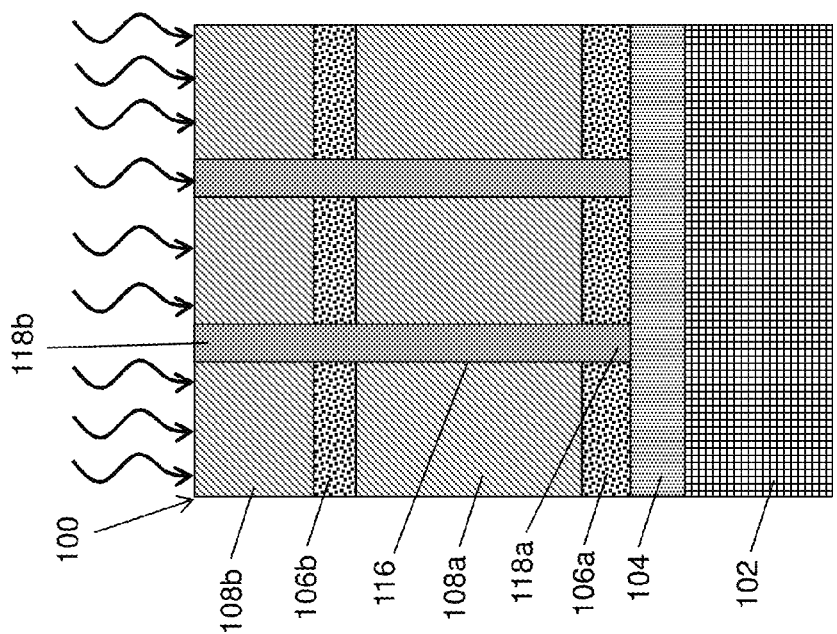

Turning now to FIG. 5, the semiconductor structure 100 is illustrated undergoing a thermal anneal process. The thermal anneal process may include, but is not limited to, a spike anneal process, laser anneal process, a flash anneal process, a rapid thermal anneal process, a furnace anneal process, or any suitable combination of those processes. The thermal anneal process exposes the semiconductor structure 100 to temperatures ranging, for example, from approximately 100 nanoseconds to approximately 1 hour, depending on the annealing temperature. In one embodiment, the anneal process is a rapid thermal anneal process with a temperature of 1000 C for 1 second. In another embodiment, the anneal process is a furnace anneal process with a temperature of 900 C for 10 minutes. The thermal anneal can be done with an environment of hydrogen, argon, helium, nitrogen, oxygen, or any suitable combination of those gases. In response to the high temperatures provided by the anneal process, the dopants (e.g., arsenic) local to the doping source layers 106a-106b are diffused into the surrounding channel region 116 as described in greater detail below.

Figure 6:
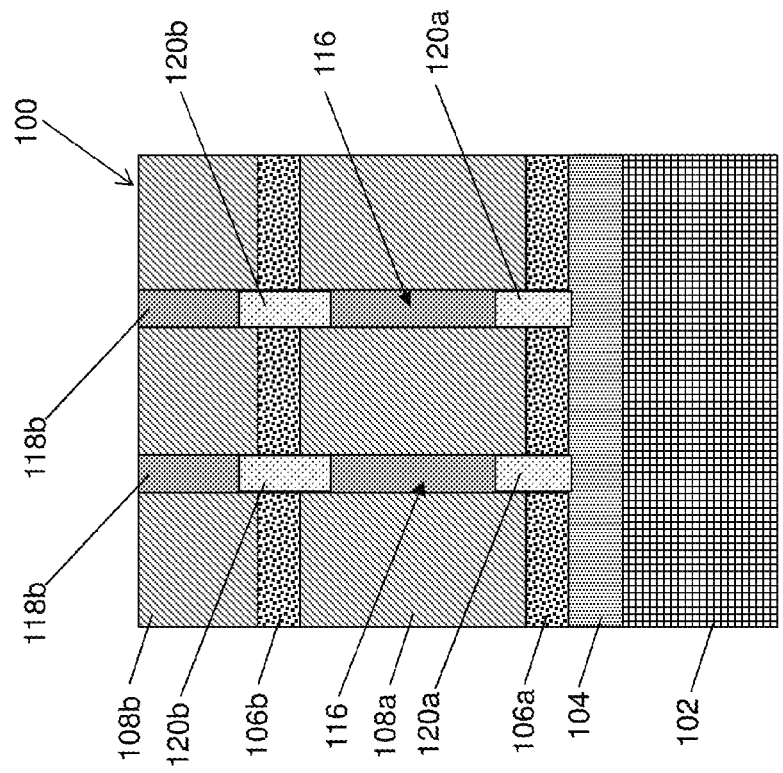

Turning to FIG. 6, the semiconductor structure 100 is illustrated following the thermal anneal process described above. As a result of the thermal process, the dopants (e.g. arsenic) from the doping source layers 106a-106b diffuse into the surrounding channel region 116 and form doped extension regions 120a-120b. In at least one embodiment, the doped extension regions include a proximate doped extension region 120a and a distal doped extension region 120b. The proximate doped extension region 120a is formed from dopants originating from the proximate doping source layer 106a and is therefore formed adjacent to the proximate doping source layer 106a, while the distal doped extension region 120b is formed from dopants originating from the distal doping source layer 106b and is therefore formed adjacent to the distal doping source layer 106b. Accordingly, the doped extension regions 120a-120b are self-aligned with the channel region 116. In at least one embodiment, the dopants from the proximate doping source layer 106a may also diffuse into a portion of the doped semiconductor layer 104, or into the substrate 102 when the doped semiconductor layer 104 is not present. In the case that the doped semiconductor layer 104 is not present, dopants diffuse into the substrate 102 to form a doped region in the substrate 102. The doped region functions as the bottom S/D of the transistor. Alternatively, the anneal process to form the extension regions can be done in the later process such as after the formation of the gate.

The vertical thickness (e.g. height) of the doped extension regions 120a-120b may range, for example, from approximately 3 nm to approximately 15 nm. In at least one embodiment, the vertical thickness of the doped extension regions 120a-120b may be controlled based on the duration of the thermal anneal processes. For example, increasing the duration of the thermal anneal process increases the amount of dopants that are diffused into the channel region 120, thereby increasing the vertical thickness (e.g., height) of the doped extension regions 120a-120b. In at least one embodiment, the dopant concentration in the extension regions next to the dopant source layer ranges from $1E19/cm^3$ to $1E20/cm^3$, although higher or lower dopant concentration can also be achieved.

As further illustrated in FIG. 6, the formation of the doped extension regions 120a-120b effectively reduces the vertical length (i.e., distance along the Z-axis) of the channel region 116. For instance, prior to performing the thermal anneal process, a non-diffused (e.g., un-doped) channel region 116 extends from an upper surface of the doped semiconductor layer 104 to the upper surface of the second sacrificial layer 108b (see FIG. 4). However, following the thermal anneal process the remaining non-diffused (e.g., un-doped) portion of the channel region 116 resides between the proximate doped extension region 120a and the distal doped extension region 120b as illustrated in FIG. 6. With respect to vertical-type FET devices, the height (i.e., distance along the Z-axis) of the channel region effectively defines the channel length. Accordingly, the channel region 116 is effectively reduced following the formation of the doped extension regions 120a-120b. In at least one embodiment, the channel region 116 may be reduced to have a channel length (vertical height) ranging from approximately 10 nm to approximately 30 nm. It should be appreciated, however, that other gate lengths may also exist. In addition, the doped extension regions 120a-120b may serve as extensions to source/drain regions of the semiconductor structure 100 as described in greater detail below.

Referring to now to FIG. 7, the semiconductor structure 100 is illustrated after forming a channel cap 122 on an upper surface of the distal channel end 118b. The channel cap 122 may be formed by first performing a timed etch that is selective to the second sacrificial layer 108b. Accordingly, the distal channel end 118b is partially recessed to form a trench (not shown) in the second sacrificial layer 108b. The trench may then be re-filled with a dielectric material such as amorphous carbon, for example. A CMP process may be performed to remove any excess dielectric material from an upper surface of the second sacrificial layer 108b thereby forming the channel cap 122 on an upper surface of the distal channel end 118b.

Turning to FIG. 8, the semiconductor structure 100 is illustrated after selectively etching the second sacrificial layer 108b and forming sacrificial hard masks 124 that encapsulate the distal channel ends 118b and any exposed portions of the distal doped extension regions 120b. In at least one embodiment, an amorphous carbon material is deposited followed by a directional etch (e.g., reactive ion etch (ME)) to form spacers on the sidewalls of 118 and 120. The spacers in combination of the cap 122 encapsulate form the sacrificial hard masks 124.

With reference now to FIG. 9, the semiconductor structure 100 is illustrated following an etching process that partially removes the distal doping source layer 106b and the second sacrificial layer 108b. In at least one embodiment, a first etching process selective to nitride material is performed to punch through the distal doping source layer 106b and expose the underlying second sacrificial layer 108b. Thereafter, a second etching process such as, for example, a reactive ion etching (ME) process selective to ASG is performed stops on an upper surface of a proximate doping source layer 106a. In this manner, portions of the distal doping source layer 106b and the second sacrificial layer 108b not covered by the sacrificial hard masks 124 are removed, while remaining portions of the distal doping source layer 106b and the second sacrificial layer 108b located beneath the sacrificial hard masks 124 are maintained.

Turning to FIG. 10, the semiconductor structure 100 is illustrated following a selective etching process that removes the remaining second sacrificial layer 108b. In at least one embodiment, an etching process selective to ASG and semiconductor material may be performed to remove the remaining second sacrificial layer 108b located between the doped source layers 106a-106b. In this manner, a void 125 is formed that exposes the channel region 116 and the extension regions 120a-120b located between the proximate and distal doping source layers 106a-106b. As further illustrated in FIG. 10, the distance between the proximate doped source layer 106a and the distal doped source layer 106b is maintained because the remaining second sacrificial layer 108b is recessed selective to the doped source layers 106a-106b. That is, the desired gate length initially defined by the first sacrificial layer 108a is maintained such that recess variations are reduced or even eliminated.

Figure 11:
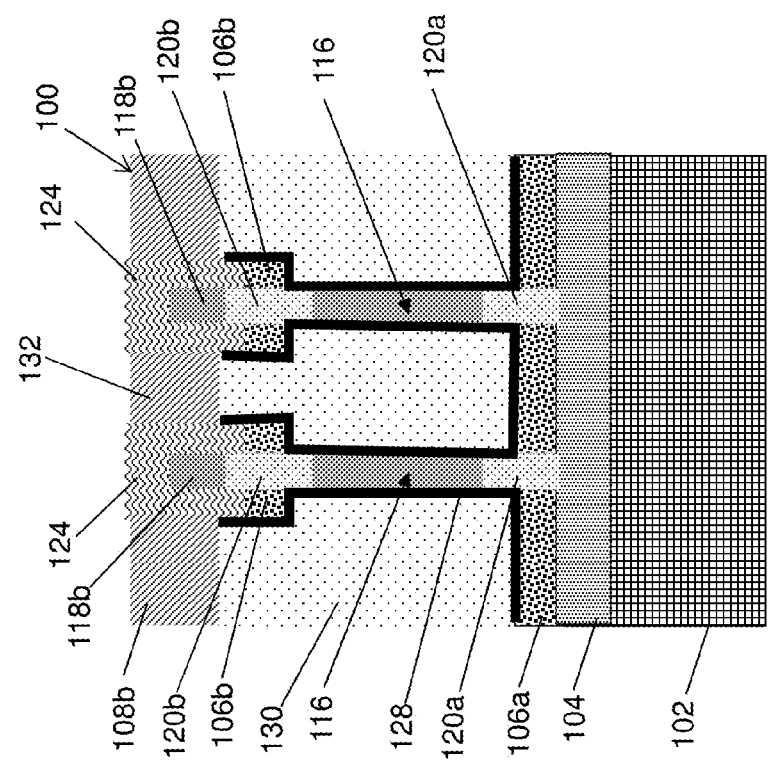

Referring now to FIG. 11, a gate structure 126 is formed which encapsulates the channel region 116, the extension regions 120a-120b, and the sacrificial hard masks 124. According to a non-limiting embodiment, the gate structure includes a gate dielectric 128 (which may include one or more individual layers) and a gate conductor material 130. A conformal deposition process may first be performed to deposit the gate dielectric 128 against the exposed surfaces of the proximate doping source layer 106a, channel region 116, extension regions 120a-120b, and sacrificial hard masks 124. The gate dielectric 128 may include, but is not limited to, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In at least one embodiment, the gate dielectric 128 includes a thin layer of hafnium oxide ($HfO_2$) having a thickness ranging from approximately 1.5 nm to approximately 3 nm.

After depositing the gate dielectric 128, the gate conductor material 130 is deposited to fill the void (previously indicated as element 125) and encapsulates the channel region 116, the extension regions 120a-120b, and the sacrificial hard masks 124. Accordingly, a gate structure 126 is formed which has a gate length that matches or substantially matches the desired gate length initially defined by the first sacrificial layer 108a. The gate conductor material may further comprise one or multiple gate workfunction setting layer formed on the gate dielectric 128. The gate conductor material may comprise materials including, but not limited to, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. A CMP process selective to the material of the sacrificial masks 124 (e.g., amorphous carbon) may be performed such that the upper surfaces of the sacrificial masks 124, the gate dielectric 128 and the gate conductor material 130 are flush with each other as further illustrated in FIG. 11.

Figure 12:
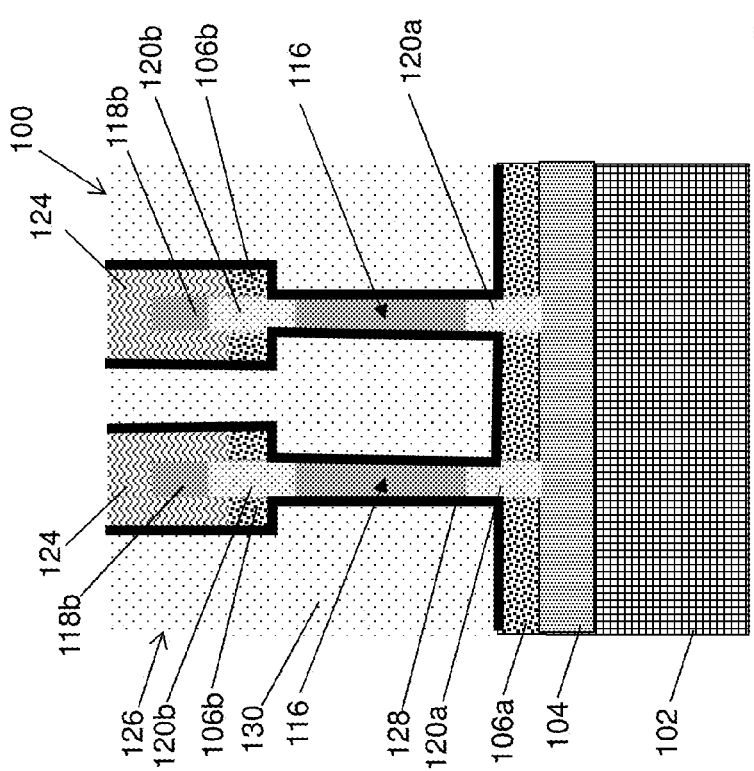

Turning to FIG. 12, a portion of the gate conductor material 130 previously covering the sacrificial hard masks 124 is replaced with a nitride capping layer 132. The nitride capping layer 132 may be formed by first recessing a portion of the gate conductor material 130 to expose the sacrificial hard masks 124. In at least one embodiment, an etched process selective to the material of the gate dielectric 128 is performed such that the gate conductor material 130 is recessed until reaching the gate dielectric 128. In another embodiment, a timed etching process may be formed to partially recess the gate conductor material 130. In at least one embodiment, the gate conductor material 130 may be recessed below the gate dielectric 128. After recessing the gate material 130, a nitride material is then deposited on an upper surface of the gate conductor material 130 so as to cover the sacrificial hard masks 124. A subsequent CMP process selective to the sacrificial hard mask material (e.g., amorphous carbon) may be performed to expose an upper surface of the sacrificial hard masks 124.

With reference now to FIG. 13, the semiconductor structure 100 is illustrated after removing the sacrificial hard masks 124 to form cavities 134 in the nitride capping layer 132. According to a non-limiting embodiment, a selective etching process that utilizes an etchant having a chemistry that attacks only sacrificial hard mask material (e.g., amorphous carbon) may be performed to etch away the sacrificial hard masks while maintaining the capping layer 132, the distal extension region 120b, the remaining distal channel end 118b, and the gate dielectric 128. In this manner, a cavity 134 is formed which exposes the distal extension region 120b and/or the remaining distal channel end 118b.

Turning to FIG. 14, the cavities (previously indicated as element 134) are filled by epitaxially growing a doped semiconductor material 136 from a respective distal channel end 118b. A CMP process that stops on an upper surface of the nitride capping layer 132 may be performed such that an upper surface of the doped epitaxially grown semiconductor material 136 is flush with the upper surface of the nitride capping layer 132. In at least one embodiment, the CMP process is omitted. The doped semiconductor material 136 remaining in the cavity may undergo a laser anneal process which activates the dopants. Accordingly, the remaining semiconductor material 136 may serve as a second S/D region 136 (i.e., a distal S/D region 136), while the doped semiconductor layer 104 serves as the first source/drain region. The doped semiconductor material 136 may be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $2\times10^{21}$ $cm^{-3}$, or preferably between $2\times10^{20}$ $cm^{-3}$ to $1\times10^{21}$ $cm^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The proximate S/D extension region 120a includes a first end that contacts the non-diffused portion of the channel region 116 and a second end that contacts the first S/D region 104. Similarly, the distal S/D extension region 120b includes a first end that contacts the non-diffused portion of the channel region 116 and a second end that contacts a second S/D region 136. Each of the S/D extension region 120a-120b extend from the first S/D region 104 and the second S/D region respectively, into the channel region 116 to define a non-diffused portion of the channel region 116 as further illustrated in FIG. 14.

Accordingly, various embodiments described above provide a vertical-type semiconductor structure 100 (e.g., a vertical FET) having a channel region 116 interposed between opposing extension regions 118a-118b. The length of the channel region 116 is precisely controlled based on the dimensions of the extension regions 118a-118b. In addition, the proximate S/D region 104 and the distal S/D region 136 are self-aligned with respect to the gate due to the extension region 118a-118b which themselves are self-aligned following the diffusion of the ASG doping source layers 106a-106b.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming source/drain (S/D) extension regions in a vertical transistor, the method comprising:
    forming a semiconductor structure having a first sacrificial layer interposed between proximate and distal doping source layers;
    forming at least one channel region that extends vertically from the proximate doping source layer to the distal doping source layer; and
    annealing the semiconductor structure such that dopants are diffused from the proximate and distal doping source layers to form a proximate S/D extension region adjacent the proximate doping source layer and a distal S/D extension region adjacent the distal S/D extension region,
    selectively removing the first sacrificial layer to form a void that exposes the proximate and distal doping source layers, the channel region, and the proximate and distal S/D extension regions; and
        filling the void with a gate structure that completely surrounds lateral sides of the channel region, while also surrounding the proximate and distal S/D extension regions.

2. The method of claim 1, wherein the selective removal of the first sacrificial layer includes selectively etching the first sacrificial layer while maintaining the proximate and distal doping source layers, the at least one channel region, and the proximate and distal S/D extension regions.

3. The method of claim 2, wherein forming the starting semiconductor structure comprises:
    forming the proximate doping source layer on an upper surface of a semiconductor substrate;
    forming the first sacrificial layer on an upper surface of the proximate doping source layer;
    forming the distal doped source layer on an upper surface of the first sacrificial layer such that the first sacrificial layer is interposed between the proximate doping source layer and the distal doping source layer; and
    forming a second sacrificial layer on an upper surface of the distal doping source layer.

4. The method of claim 3, wherein forming the starting semiconductor structure further comprises:
    forming at least one trench through the semiconductor structure, the at least one trench extending from an upper surface of the second sacrificial layer to the upper surface of the semiconductor substrate; and
    filling the at least one trench with a semiconductor channel material to form the at least one channel region.

5. The method of claim 4, wherein filling the at least one trench comprises epitaxially growing a semiconductor material from the upper surface of the semiconductor substrate.

6. The method of claim 4, wherein an upper portion of the proximate and distal S/D extension regions surrounded by the gate structure extends into the at least one trench.

7. The method of claim 1, wherein annealing the semiconductor structure includes annealing the distal doping source layer such that the distal S/D extension region is formed between a first non-diffused portion of the at least one channel region and a second non-diffused portion of the at least one channel region, the second non-diffused portion interposed between the proximate S/D extension region and the distal S/D extension region.

8. The method of claim 7, further comprising epitaxially growing a semiconductor material from the first non-diffused portion to form an S/D region that is separated from the second non-diffused channel portion by the distal S/D extension region.

9. The method of claim 1, where the proximate S/D extension region and the distal S/D extension region are each vertically aligned with the channel region.

10. A method of forming a gate structure in a vertical transistor, the method comprising:

forming a semiconductor structure having a first sacrificial layer interposed between proximate and distal doping source layers, the first sacrificial layer surrounding a channel region and defining a desired gate length of the vertical transistor;

annealing the semiconductor structure such that dopants are diffused from the proximate and distal doping source layers to form opposing proximate and distal S/D extension regions that extend into the channel region;

selectively removing the first sacrificial layer to form a void that exposes the region;

filling the void with a gate metal material so as to form a gate structure having a gate length that substantially matches the desired gate length such the gate structure completely surrounds lateral sides of the channel region, while also surrounding the proximate and distal S/D extension regions, wherein annealing the semiconductor structure includes annealing the distal doping source layer such that the distal S/D extension region is formed between a first non-diffused portion of the channel region and a second non-diffused portion of the channel region, the second non-diffused portion interposed between the proximate S/D extension region and the distal S/D extension region.

11. The method of claim 10, wherein the gate film includes a layer of high-k material.

12. The method of claim 11, wherein the high-k material is hafnium oxide ($HfO_2$).

13. The method of claim 10, wherein the proximate and distal doping source layers comprise an arsenic oxide material, wherein the proximate and distal doping S/D extension region comprise arsenic, and wherein the channel region comprises silicon.

14. The method of claim 13, wherein the selective removal of the first sacrificial layer includes performing an etching process selective to arsenic oxide, arsenic and silicon so as to etch the first sacrificial layer while preserving dimensions of the desired gate length defined by the void.

15. The method of claim 14, further comprising epitaxially growing a semiconductor material from the first non-diffused portion to form an S/D region that is separated from the second non-diffused channel portion by the distal S/D extension region.

16. The method of claim 10, where the proximate S/D extension region and the distal S/D extension region are each vertically aligned with the channel region.

* * * * *